United States Patent [19]
Brehmer et al.

[11] Patent Number: 5,477,190
[45] Date of Patent: Dec. 19, 1995

[54] LOW VOLTAGE LINEAR OUTPUT BUFFER OPERATIONAL AMPLIFIER

[75] Inventors: Geoffrey G. Brehmer, Lexington; Carlin D. Cabler, Austin, both of Tex.

[73] Assignee: Advanced Micro Devices, Inc., Sunnyvale, Calif.

[21] Appl. No.: 357,953

[22] Filed: Dec. 16, 1994

[51] Int. Cl.⁶ .................... H03F 3/45; H03F 3/16
[52] U.S. Cl. ................ 330/253; 330/292; 330/300
[58] Field of Search ................... 330/253, 292, 330/300, 311

[56] References Cited

U.S. PATENT DOCUMENTS

| | | | |
|---|---|---|---|
| 4,335,355 | 6/1982 | Haque | 330/253 |
| 4,484,148 | 11/1984 | Wieser et al. | 330/253 |
| 4,559,502 | 12/1985 | Huijsing | 330/294 |
| 4,661,779 | 4/1987 | Okamoto | 330/253 |
| 4,829,266 | 5/1989 | Pernici et al. | 330/253 |
| 4,881,045 | 11/1989 | Dillman | 330/253 |
| 4,897,596 | 1/1990 | Hughes et al. | 323/315 |
| 4,926,068 | 5/1990 | Fujita | 307/359 |
| 4,939,516 | 7/1990 | Early | 341/143 |
| 4,988,954 | 1/1991 | Stern et al. | 330/264 |
| 5,039,989 | 8/1991 | Welland et al. | 341/143 |
| 5,097,223 | 3/1992 | Alexander | 330/126 |
| 5,113,129 | 5/1992 | Hughes | 323/316 |
| 5,117,200 | 5/1992 | Scott, III | 330/253 |
| 5,121,080 | 6/1992 | Scott, III et al. | 330/260 |
| 5,126,685 | 6/1992 | Platt et al. | 330/85 |
| 5,140,279 | 8/1992 | Scott, III | 330/156 |
| 5,170,134 | 12/1992 | Bien | 330/255 |
| 5,198,782 | 3/1993 | Scott | 330/277 |
| 5,212,458 | 5/1993 | Fitzpatrick et al. | 330/288 |
| 5,239,210 | 8/1993 | Scott | 307/355 |
| 5,243,235 | 9/1993 | Wakayama et al. | 307/353 |
| 5,323,121 | 6/1994 | Butler | 330/252 |
| 5,323,122 | 6/1994 | Bowers | 330/263 |
| 5,349,305 | 9/1994 | Hsiao et al. | 330/253 |
| 5,394,111 | 2/1995 | Tsuji et al. | 330/300 X |

FOREIGN PATENT DOCUMENTS

0479119A2  4/1992  European Pat. Off. .

OTHER PUBLICATIONS

"A 50-MHz CMOS Variable Gain Amplifier for Magnetic Data Storage Systems," R. Gomez and A. A. Abidi, *IEEE Journal of Solid-State Circuits* (1992) Jun., No. 6, New York, pp. 935–939.

"Design and Applications of Tunable Analog BiCMOS Circuits," J. Fichtel *IEEE Journal of Solid-State Circuits*, (1992) Jul., No. 7., New York, pp. 1101–1104.

*Primary Examiner*—Steven Mottola
*Attorney, Agent, or Firm*—Fulbright & Jaworski

[57] ABSTRACT

This invention includes a linear, low noise, low voltage operational amplifier which drives variable resistive and capacitive output loads and includes a slave emitter follower buffer stage.

24 Claims, 9 Drawing Sheets

LOW VOLTAGE LINEAR OUTPUT BUFFER OPERATIONAL AMPLIFIER

BACKGROUND OF THE INVENTION

1. Field of the Invention

This invention relates to a low voltage linear output buffer operational amplifier. This invention further relates to a low voltage linear output buffer operational amplifier capable of driving variable resistive and capacitive output loads.

2. Brief Description of the Related Technology

Typically, a class A operational amplifier includes a reference current in the output stage, which is configured as either a source or a sink. The class A amplifier typically modulates the gate of a MOSFET transistor or the base of a bipolar transistor to modulate the amplifier output voltage. This configuration is typically referred to as a two-stage class A operational amplifier. Class A MOSFET operational amplifiers are problematic since they inherently have difficulty maintaining stability over a wide range of resistive and capacitive loads.

Several known methods of compensating this instability are:

(1) Pole splitting/Miller compensation methods;
(2) Pole zero compensation; and
(3) Pole splitting with feed forward blocking techniques.

Other techniques are known to those in the art.

SUMMARY OF THE INVENTION

The present invention is for a class A linear, low noise operational amplifier capable of driving variable resistive and capacitive loads. The two-stage class A structure of the present invention includes an emitter follower output stage for driving variable resistive and capacitive loads, and an emitter follower slave, or emitter follower feedback amplifier, stage for eliminating a feedforward zero in the output path.

An object of the present invention is an operational amplifier that provides linear and lower power operation for high quality audio applications.

Another object of the present invention is for an operational amplifier capable of driving external circuitry and maintaining stability over wide variations of resistive and capacitive loads.

A further object of the present invention is for an operational amplifier that is very linear, with low noise that does not consume a large amount of silicon area in a monolithic integrated circuit.

DETAILED DESCRIPTION OF THE PREFERRED EMBODIMENT

Figure 1:
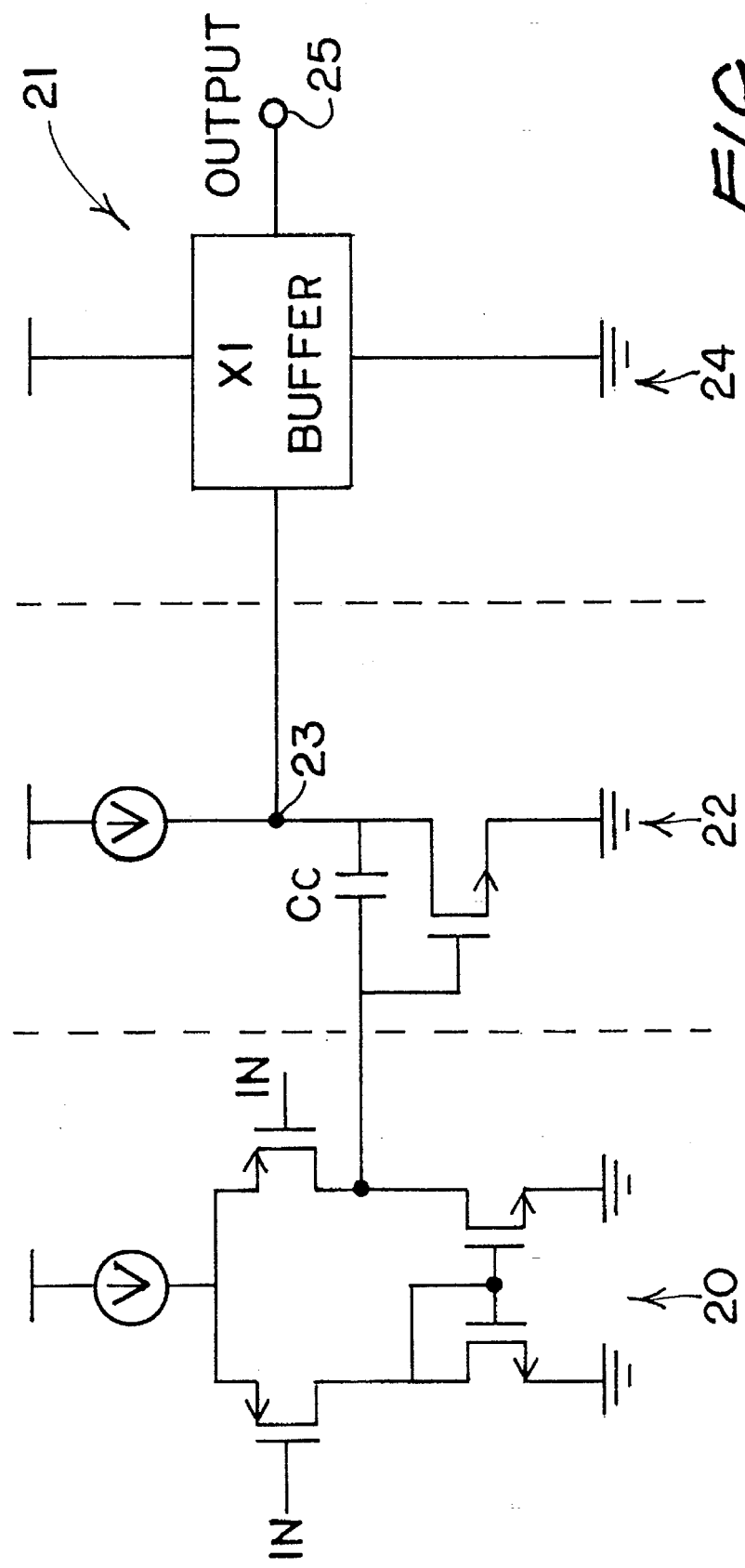
FIG. 1 is a prior art schematic of a simple pole splitting method used to compensate an operational amplifier.

FIG. 1 illustrates a prior art method for compensating a two-stage class A operational amplifier. Input stage 20, second stage 22 and output stage 24 are illustrated. This method uses a simple pole splitting technique to compensate the operational amplifier 21 illustrated. A feedforward zero is produced at second stage output node 23 and is propagated through output stage 24 to output node 25. Propagation of this produced zero through output stage 24 degrades the phase margin of operational amplifier 21 and presents problems in driving heavy capacitive loads.

Figure 2:
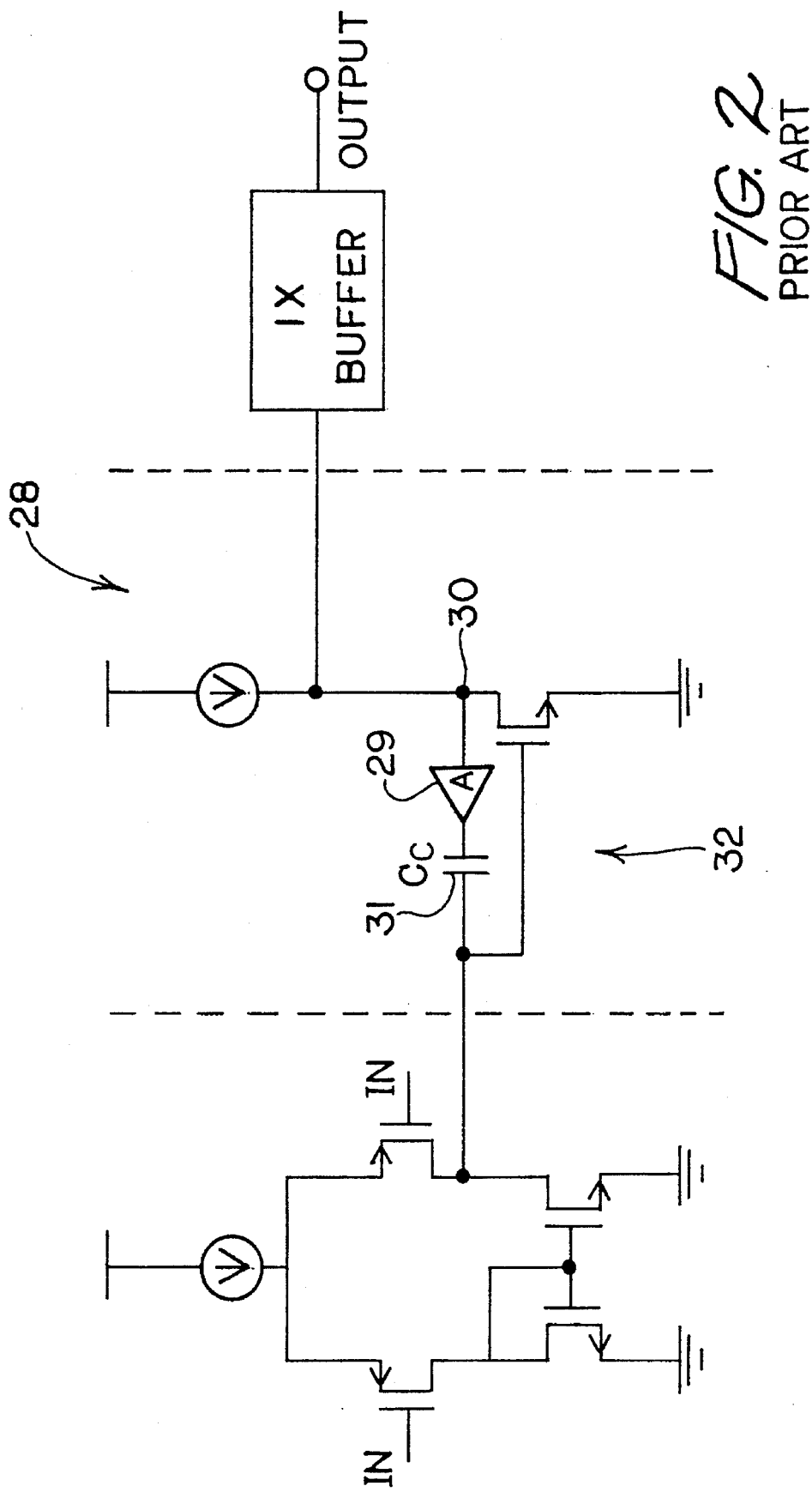
FIG. 2 is a prior art schematic illustrating another pole splitting configuration with feedforward blocking for compensating an operational amplifier.

In another compensation method, illustrated by the block diagram in FIG. 2, an operational amplifier 28 includes a feedback amplifier 29 connected between the second stage output node 30 and compensation capacitor 31. This method performs a pole splitting function and also eliminates the feed forward path across compensation capacitor 31 and the zero produced at second stage output node 23 in FIG. 1. Operational amplifier 28 in FIG. 2 is capable of driving high capacitive loads without difficulty, however implementation of feedback amplifier 29 is difficult to realize in a low voltage embodiment. The configuration illustrated in FIG. 2 does not detail an implementation for achieving a very linear output, as does the present invention.

Figure 3:
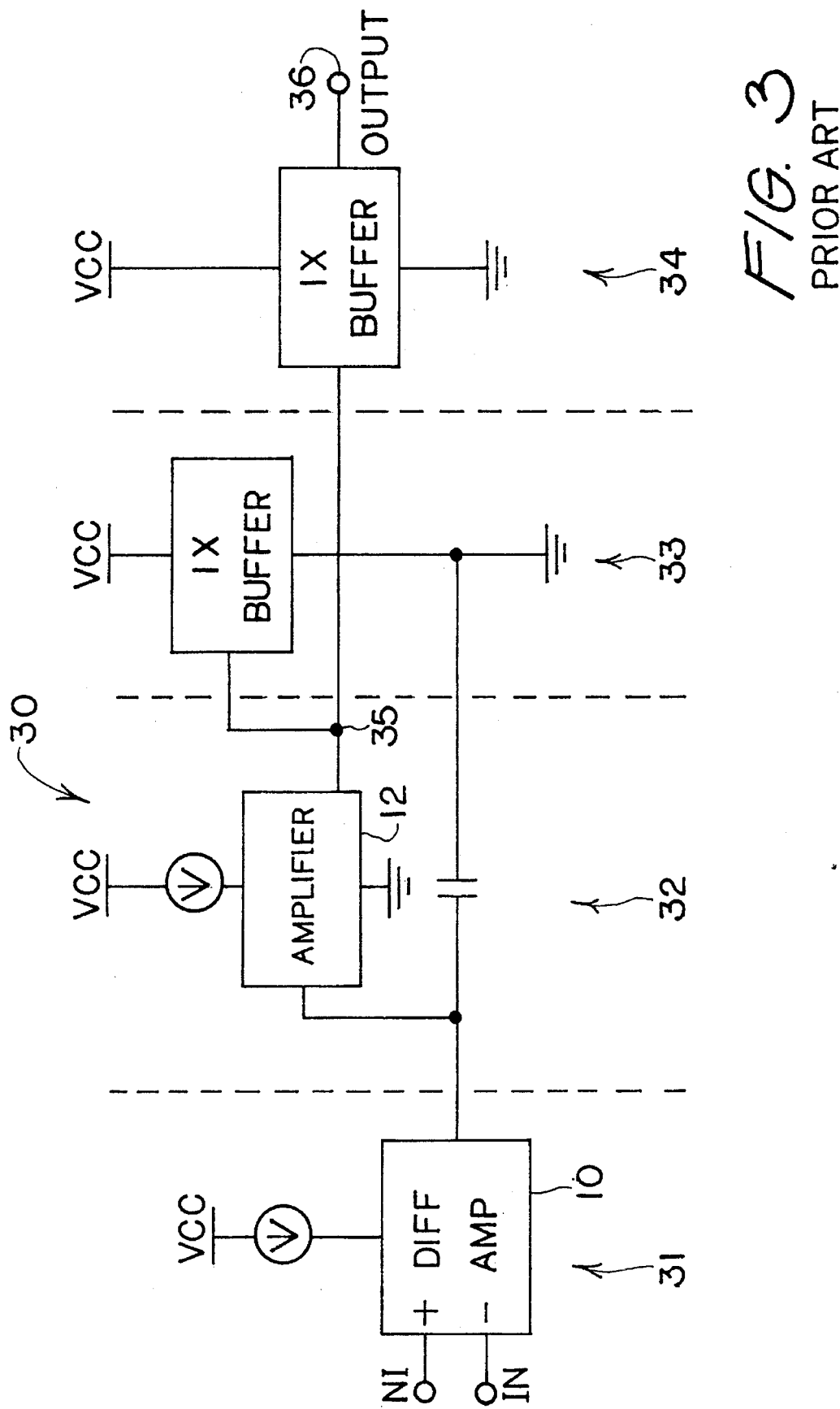
FIG. 3 schematically illustrates another prior art pole splitting with feedforward blocking compensation.

FIG. 3 illustrates a block diagram embodiment of the prior art. This implementation illustrates an operational amplifier 30, which includes a differential input gain stage 31, which includes a differential amplifier 10; a second gain stage 32, which includes amplifier 12; a slave buffer stage 33; and an output stage 34. An embodiment of FIG. 3 is shown schematically in FIG. 4. The single-stage differential input folded cascode first gain stage structure 42 on the front end of operational amplifier 40 is more specifically described in application Ser. No. 08/085,898, entitled *Op Amp for Low Supply Voltage Applications,* by Brehmer, co-inventor of the present invention, where that invention is assigned to the common assignee of the present invention. The architecture shown in FIG. 3, and embodied in FIG. 4 with a specific implementation, utilizes a pole-splitting compensation method which eliminates the feed forward path for the zero produced at second stage output node 35. The slave buffer stage 33 eliminates the feed forward of the zero from second stage output node 35 (FIG. 3) to output node 36. Operational amplifier 30 is thusly able to drive higher capacitive loads and provide a stable linear output over a wide range of resistive and capacitive loading.

Figure 4:
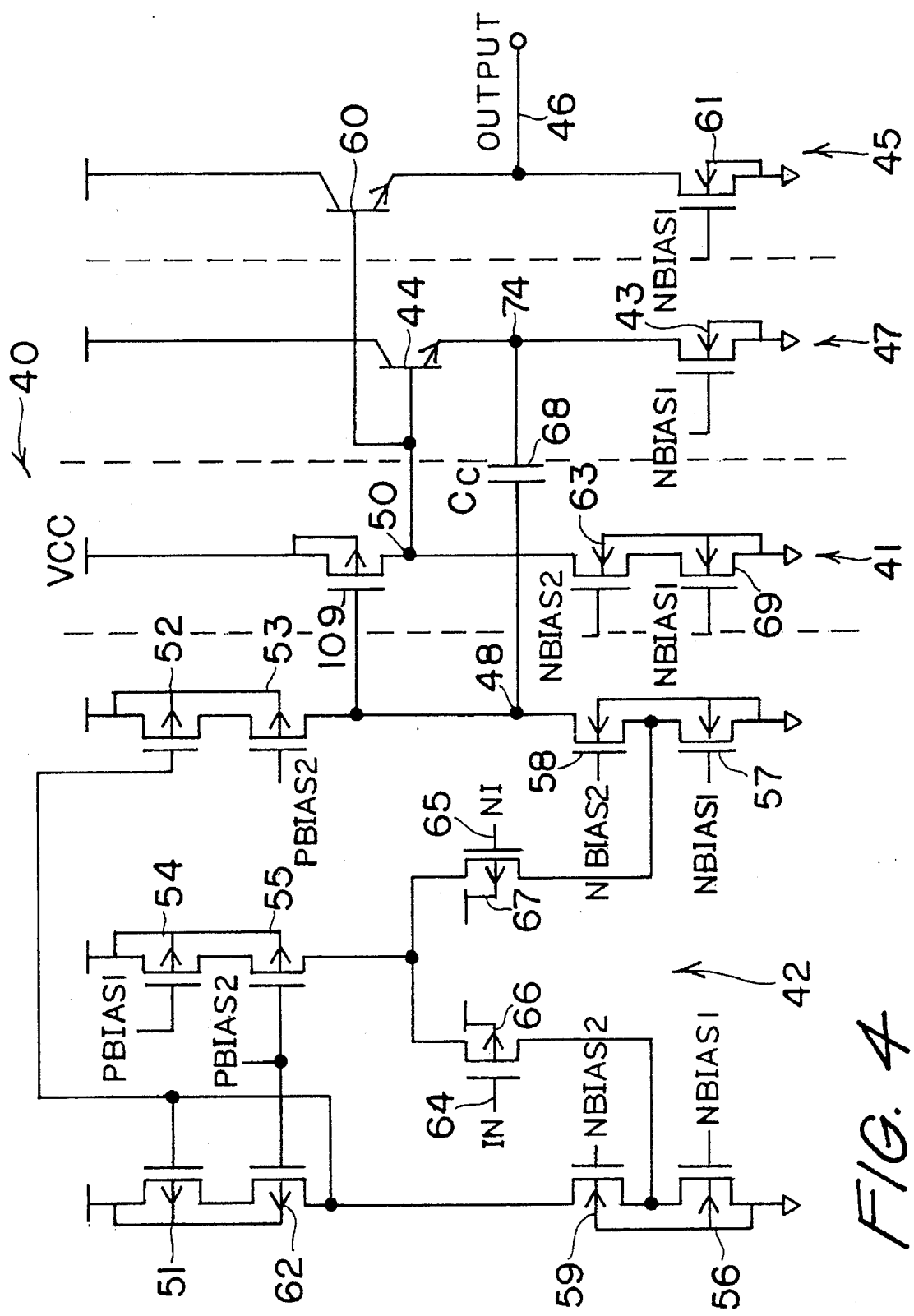
FIGS. 4, 5, 6, 7, 8 and 9 schematically illustrate embodiments of implementations of the pole splitting feedforward blocking compensation of the present invention.

FIG. 4 schematically illustrates a preferred embodiment of the class A operational amplifier shown in FIG. 3. Frequency compensation for operational amplifier 40 is provided by compensation capacitor 68, which is connected between the first gain stage output 48 and the emitter follower slave stage output 74, and by the emitter follower slave stage 47, which includes output buffer transistor 44 and N-channel current sinking MOSFET transistor 43. The emitter follower output driving stage 45 includes buffer transistor 60 and current sinking N-channel MOSFET transistor 61. The two-stage folded cascode front end of op amp 40, which includes single-stage folded cascode first gain stage circuitry 42 and second gain stage 41 of operational amplifier 40, is buffered from output loading at output node 46. Thus, gain remains very high and very linear with capacitive and resistive load changes at output node 46. For high output linearity for operational amplifier 40 of the present invention, for each implementation described herein, it is important that the operating characteristics of slave stage 47 and output driving stage 45 be identical.

The embodiment of op amp 40 shown in FIG. 4 is different from prior art configurations since it establishes an emitter follower slave stage 47 which tracks the output signal at output node 46 as the output signal swings and uses simple pole splitting techniques between output node 46 and the first gain stage output 48. The second gain stage output 50 of second gain stage 41 is buffered from output node 46 by transistor 60 in emitter follower output stage 45 and by transistor 44 in emitter follower slave stage 47. Second gain stage 41 includes compensation capacitor 68, P-channel MOSFET 109 and N-channel MOSFET 69 connected as shown. P-channel MOSFET transistors 53, 55 and 62 are biased with threshold bias signal PBIAS2, as shown. P-channel MOSFET 54 is biased with threshold bias signal PBIAS1, as shown. N-channel MOSFETs 43, 56, 57, 61 and 69 are biased with threshold bias signal NBIAS1, as shown. N-channel MOSFETs 58, 59 and 63 are biased with threshold bias signal NBIAS2, as shown.

The inverting input node 64 of operational amplifier 40 is input to P-channel MOSFET 66. The non-inverting input node 65 of operational amplifier 40 is input to P-channel MOSFET 67. Throughout this application, for each op amp embodiment, the threshold bias signals (PBIAS1,2) provided to the P-channel MOSFET transistors as shown in the figures, and the threshold bias signals (NBIAS1,2) provided to the N-channel MOSFETs as shown in the figures.

Figure 5:
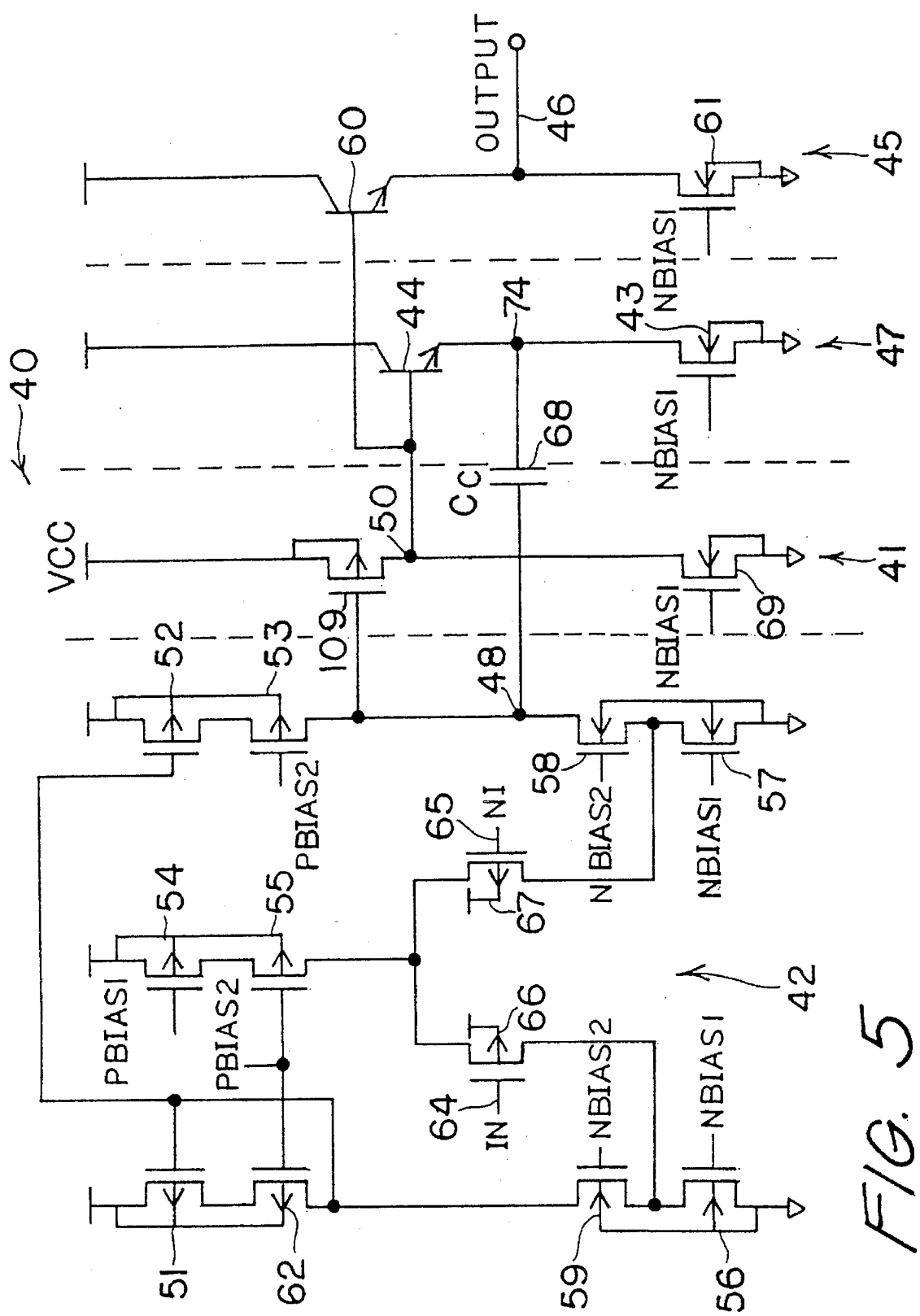

FIG. 5 schematically illustrates another embodiment of the op amp 40 of the present invention wherein the second gain stage 41 does not include a current sinking cascode configuration, as does the embodiment of operational amplifier 40 of FIG. 4. In FIG. 5, current sinking N-channel MOSFETs 69, 43 and 61 provide current sinking capabilities for the second gain stage 41, the emitter follower slave stage 47 and the emitter follower output stage 45, respectively.

Figure 6:
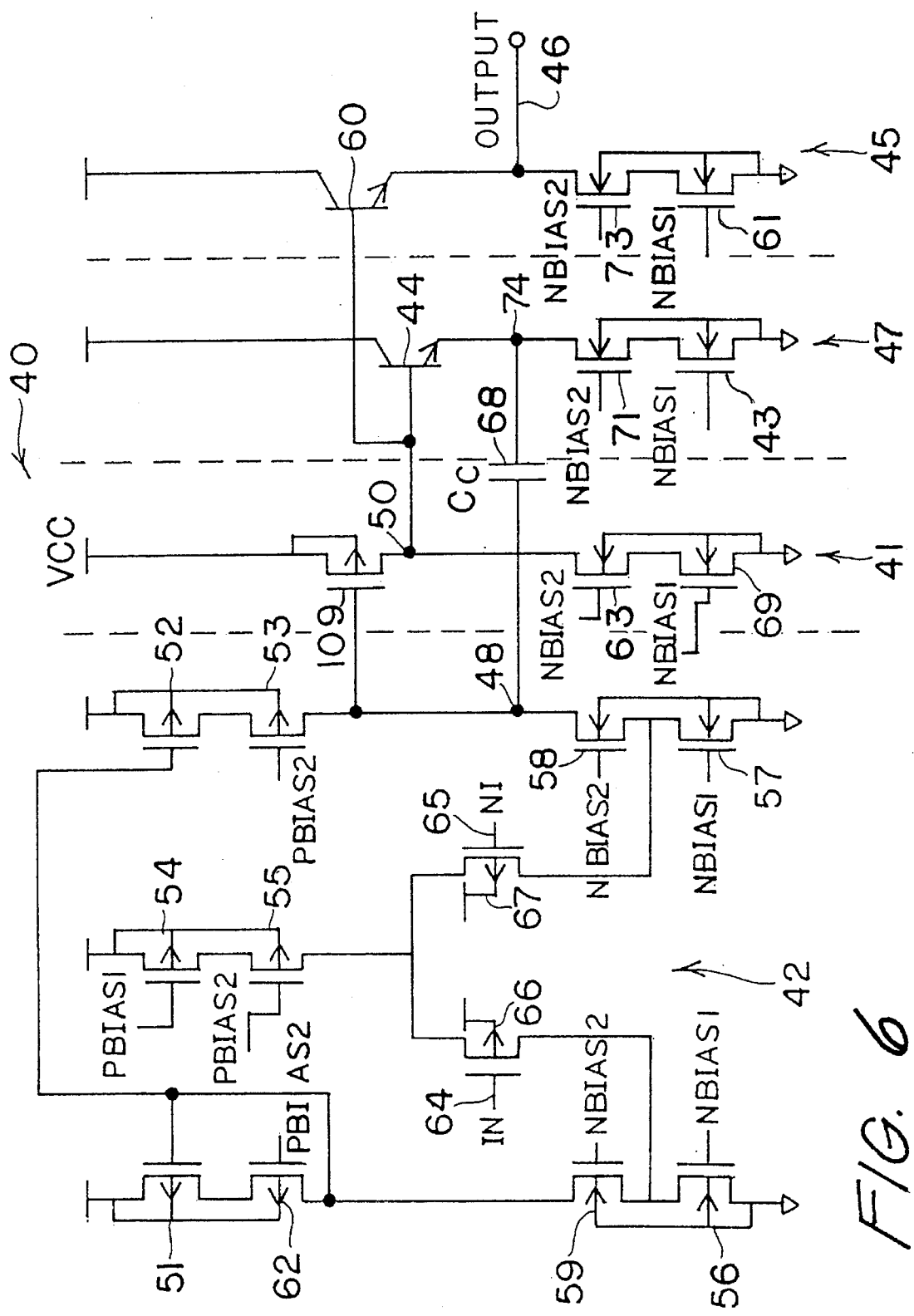

The embodiment of operational amplifier 40 shown in FIG. 6 includes a second gain stage 41 which includes a current sinking cascode configuration of N-channel MOSFETs 63 and 69; an emitter follower slave stage 47 which includes a current sinking cascode configuration of N-channel MOSFETs 43 and 71; and an emitter follower output driving stage 45 which includes a current sinking cascode configuration of N-channel MOSFETs 61 and 73.

Figure 7:
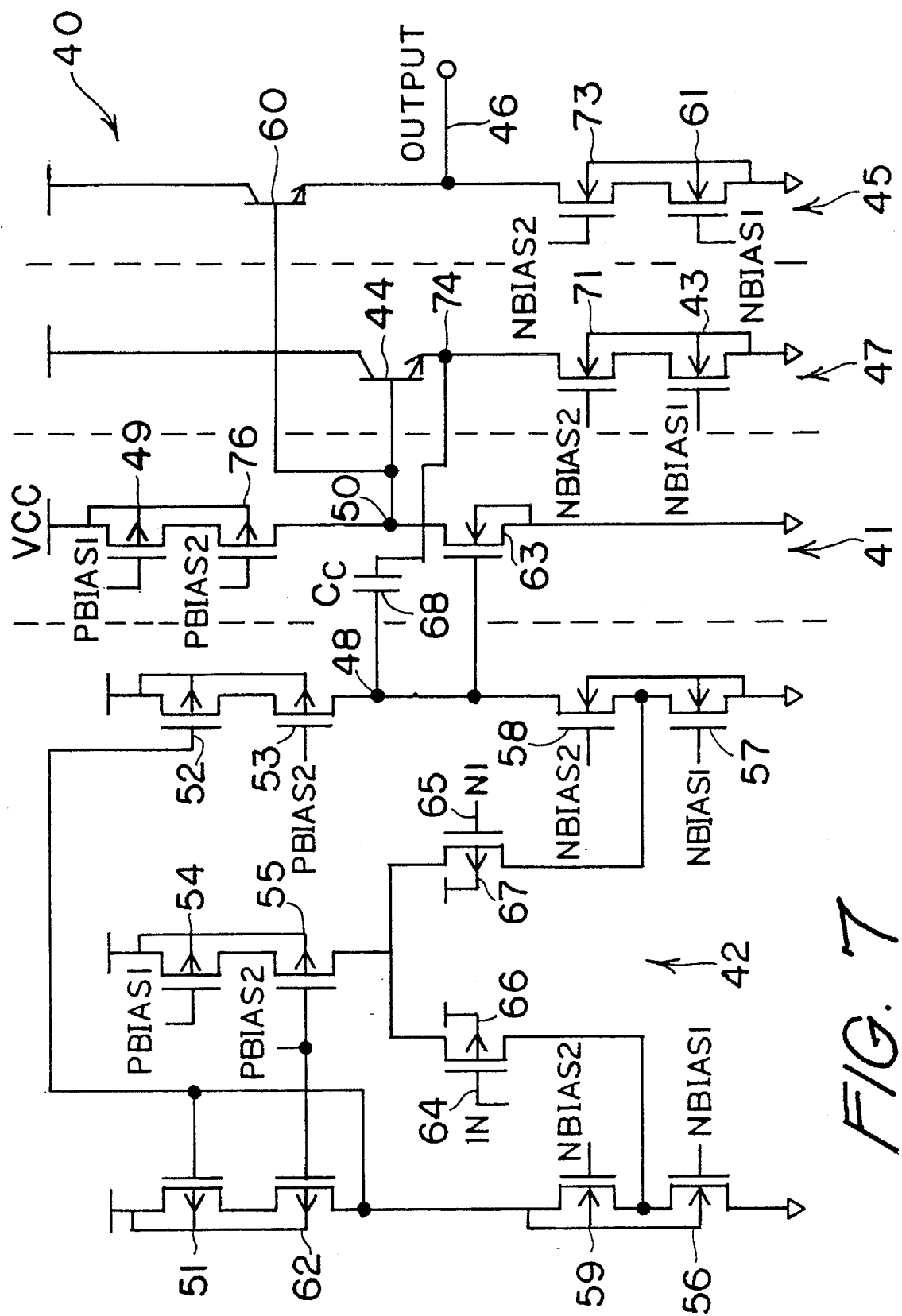

FIG. 7 illustrates another embodiment of operational amplifier 40, which includes a current source cascode configuration of P-channel MOSFET transistors 49 and 76 in second gain stage 41 for driving buffer transistors 44 and 60 via second gain stage output 50, and includes N-channel MOSFET 63 connected to the output 48 of first gain stage 42 and the output 50 of second gain stage 41. Emitter follower slave stage 47 includes a current sinking cascode configuration of N-channel MOSFETs 43 and 71. Also, emitter follower output driving stage 45 includes a current sinking cascode configuration of N-channel MOSFETs 61 and 73.

Figure 8:
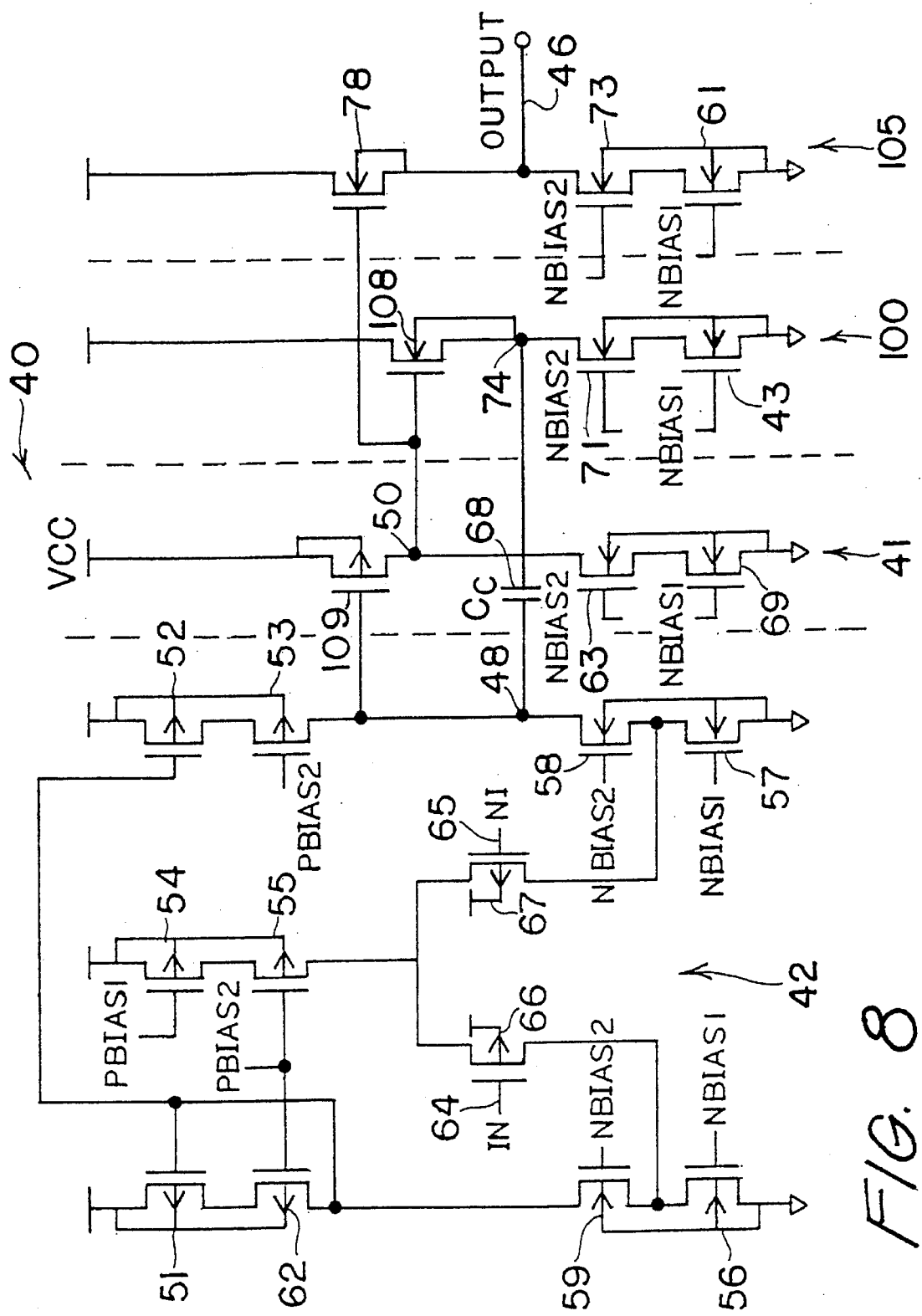

FIG. 8 illustrates another embodiment of operational amplifier 40. Second gain stage 41 includes a current sinking cascode configuration of N-channel MOSFETs 63 and 69 and a P-channel transistor 109 connected between VCC and second gain stage output 50. Source follower slave stage 100 includes a current sinking cascode configuration of N-channel MOSFETs 43 and 71 and a N-channel MOSFET 108 connected between VCC and output 74. A current sinking cascode configuration of N-channel MOSFETs, 61 and 73, and N-channel MOSFET buffer transistor 78 connected between VCC and output 46, are shown in output driving stage 105. For high output linearity of the operational amplifier 40 of the present invention, it is important that source follower slave stage 100 and output driving stage 105 have identical operating characteristics.

Figure 9:
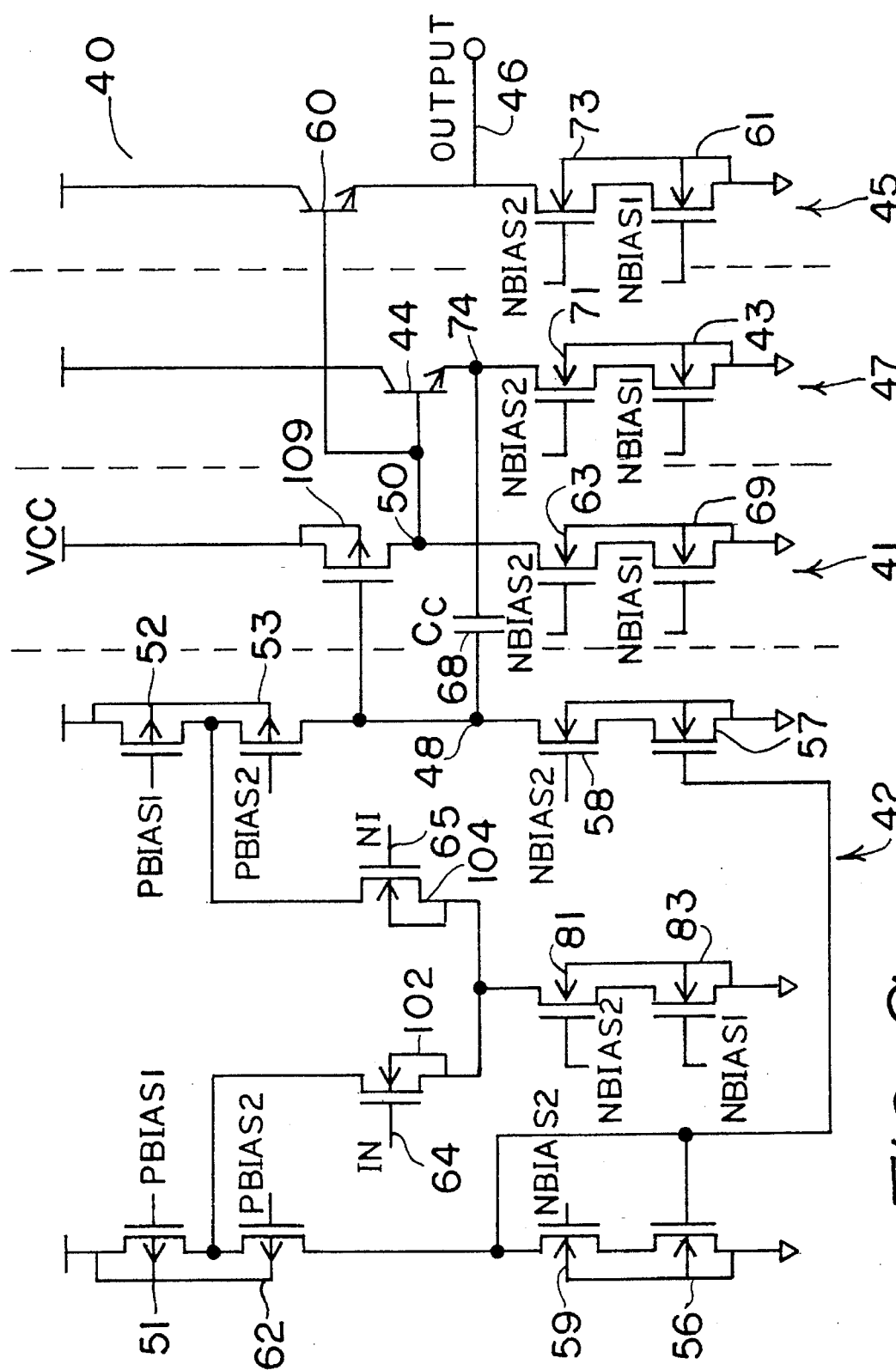

In the embodiment of operational amplifier 40 shown in FIG. 9, the folded cascode single-stage first gain stage 42 includes a current sink configuration of N-channel MOSFETs 81 and 83. Additionally, second gain stage 41 includes a current sinking cascode configuration of N-channel MOSFETs 63 and 69; emitter follower slave stage 47 includes a current sinking cascode configuration of N-channel MOSFETs 43 and 71; and emitter follower output driving stage 45 includes a current sinking cascode configuration of N-channel MOSFETs 61 and 73. The inverting input node 64 of operational amplifier 40 is input to N-channel MOSFET 102. The non-inverting input node 65 of operational amplifier 40 is input to N-channel MOSFET 104.

The foregoing disclosure and description of the invention are illustrative and explanatory of the preferred embodiments, and changes in the individual components, elements and connections may be made without departing from the spirit of the invention.

What is claimed is:

1. A linear, low noise operational amplifier, comprising:
   a first gain stage, including a plurality of differential inputs and an output, wherein a plurality of current sourcing transistors in a cascode configuration are connected to said plurality of differential inputs;

a second gain stage, including an input connected to said output of said first gain stage and including an output;

an emitter follower slave stage, including a compensation capacitor, a first buffer transistor, a first current sinking transistor and an output, wherein the emitter of said first buffer transistor is connected to said output of said emitter follower slave stage output and said first current sinking transistor is connected to said output of said emitter follower slave stage and wherein said compensation capacitor connected between said output of said first gain stage and said output of said emitter follower slave stage; and an emitter follower output stage, including a second buffer transistor, a second current sinking transistor and an output, wherein the emitter of said second buffer transistor and said current sinking transistor are connected to said output of said emitter follower output stage.

2. The operational amplifier of claim 1, wherein said first or second current sinking transistors is a N-channel MOSFET.

3. The operational amplifier of claim 1, wherein said second gain stage includes a plurality of N-channel MOSFETs arranged in a current sinking cascode configuration which are connected to said output of said second gain stage.

4. The operational amplifier of claim 1, wherein said plurality of current sourcing transistors in said first gain stage are P-channel MOSFETs.

5. A linear, low noise operational amplifier, comprising:
   a first gain stage, including a plurality of differential inputs, and an output, wherein a plurality of current sourcing transistors in a cascode configuration are connected to said plurality of differential inputs;

a second gain stage, including an input connected to said output of said first gain stage, an output, and a transistor connected to said output of said first and said second gain stage;

an emitter follower slave stage, including an input connected to said output of said second gain stage, and an output, wherein said emitter follower slave stage output is connected to a compensation capacitor, to a first buffer transistor, and to a first current sinking transistor; and an emitter follower output stage, which includes a second buffer transistor which is connected to the output of said second gain stage, an output, wherein said second buffer transistor and a second current sinking transistor are connected to said output of said emitter follower output stage.

6. The operational amplifier of claim 5, wherein said second gain stage further comprises a N-channel MOSFET connected between said second gain stage output and ground.

7. The operational amplifier of claim 5, wherein said plurality of current sourcing transistors in said first gain stage are P-channel MOSFETs.

8. The operational amplifier of claim 5, wherein said first and/or second current sinking transistors are N-channel MOSFETs.

9. The operational amplifier of claim 5, further comprising a P-channel MOSFET in said second gain stage connected between VCC and said second gain stage output.

10. An linear, low noise operational amplifier, comprising:

a first gain stage, including a plurality of differential inputs, and an output, wherein a plurality of current sourcing transistors in a cascode configuration are connected to said plurality of differential inputs;

a second gain stage, including an input connected to said output of said first gain stage, an output and a first plurality of current sinking transistors configured in a cascode configuration connected to said output of said second gain stage;

an emitter follower slave stage, including an input connected to said output of said second gain stage, an output and a first buffer transistor, wherein the emitter of said first buffer transistor is connected to said output of said emitter follower slave stage, and wherein a second plurality of current sinking transistors is connected to said output of said emitter follower slave stage; and an emitter follower output stage, including a second buffer transistor connected to an input of said first buffer transistor, an output, wherein the emitter of said second buffer transistor is connected to said output of said emitter follower output stage, and wherein a third plurality of current sinking transistors in a cascode configuration is connected to said output of said emitter follower output stage.

11. The operational amplifier of claim 10, wherein said first, second or third plurality of current sinking transistors are N-channel MOSFETs.

12. The operational amplifier of claim 10 further comprising a compensation capacitor connected between said output of said first gain stage and said emitter of said first buffer transistor.

13. A linear, low noise operational amplifier, comprising:

a first gain stage, including a plurality of differential inputs and an output;

a second gain stage, including an input connected to said output of said first gain stage and an output, wherein said second gain stage output is connected to a plurality of current sourcing transistors in a cascode configuration;

an emitter follower slave stage, including a first buffer transistor connected to said output of said second gain stage and an output, wherein said output of said emitter follower slave stage is connected to a first plurality of current sinking transistors in a cascode configuration; and an emitter follower output stage, including a second buffer transistor which is connected to said output of said second gain stage and an output, wherein said output of said emitter follower output stage is connected to an emitter of said second buffer transistor and is connected to a second plurality of current sinking cascode configuration of N-channel MOSFETs.

14. The operational amplifier of claim 13, further comprising a compensation capacitor connected between said output of said first gain stage and the emitter of said first buffer transistor.

15. The operational amplifier of claim 13, further comprising a second stage N-channel MOSFET in said second gain stage connected between said second gain stage output and ground, wherein said second stage N-channel MOSFET is driven by said output of said first gain stage.

16. The operational amplifier of claim 13, wherein said first or second plurality of current sinking transistors are N-channel MOSFETs.

17. A linear, low noise operational amplifier, comprising:

a first gain stage, including a plurality of differential inputs and an output;

a second gain stage, including an input connected to said output of said first gain stage and an output, wherein said second gain stage output is connected to a second stage P-channel MOSFET and is connected to a first plurality of current sinking transistors in a cascode configuration;

a source follower slave stage, including a first buffer transistor connected to said output of said second gain stage and an output, wherein said output of said source follower slave stage is connected to said first buffer transistor and to a second plurality of current sinking transistors in a cascode configuration; and a source follower output stage, including a second buffer transistor connected to said output of said second gain stage and an output, wherein said source follower output stage output is connected to said second buffer transistor and to a third plurality of current sinking transistors in a cascode configuration.

18. The operational amplifier of claim 17, further comprising a compensation capacitor connected between said output of said first gain stage and said first buffer transistor.

19. The operational amplifier of claim 17, wherein said first or second buffer transistor is a N-channel MOSFET.

20. The operational amplifier of claim 17, wherein said first, second or third plurality of current sinking transistors are N-channel MOSFETs.

21. A linear, low noise operational amplifier, comprising:

a first gain stage, including a plurality of differential inputs, a first plurality of current sinking transistors in a cascode configuration connected to said plurality of differential inputs, and an output;

a second gain stage, including an input connected to said output of said first gain stage and an output, wherein said second gain stage output is connected to a second plurality of current sinking transistors in a cascode configuration;

an emitter follower slave stage, including an input connected to said output of said second gain stage, a first buffer transistor connected to said output of said second gain stage and an output, wherein said output of said emitter follower slave stage is connected to a third plurality of current sinking transistors in a cascode configuration; and an emitter follower output stage, including a second buffer transistor connected to said output of said second gain stage and an output, wherein said emitter follower output stage output is connected to the emitter of said second buffer transistor and is connected to a fourth plurality of current sinking transistors in a cascode configuration.

22. The operational amplifier of claim 21, further comprising a compensation capacitor connected between said output of said first gain stage and the emitter of said first buffer transistor.

23. The operational amplifier of claim 21, wherein said first, second, third or fourth plurality of current sinking transistors are N-channel MOSFETs.

24. The operational amplifier of claim 21, further comprising a second stage P-channel MOSFET connected to said second gain stage output.

* * * * *